US010615747B2

(12) United States Patent
Ito et al.

(10) Patent No.: US 10,615,747 B2
(45) Date of Patent: Apr. 7, 2020

(54) VIBRATOR DEVICE, OSCILLATOR, ELECTRONIC DEVICE, AND VEHICLE

(71) Applicant: SEIKO EPSON CORPORATION, Tokyo (JP)

(72) Inventors: Hisahiro Ito, Minowa-machi (JP); Tetsuya Otsuki, Fujimi-machi (JP); Mitsuaki Sawada, Fujimi-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 44 days.

(21) Appl. No.: 15/914,606

(22) Filed: Mar. 7, 2018

(65) Prior Publication Data

US 2018/0269834 A1    Sep. 20, 2018

(30) Foreign Application Priority Data

Mar. 15, 2017  (JP) .................. 2017-049699

(51) Int. Cl.
  *H01L 41/09*  (2006.01)
  *H03B 5/32*  (2006.01)
  (Continued)

(52) U.S. Cl.
  CPC ............. *H03B 5/32* (2013.01); *H03H 9/0514* (2013.01); *H03H 9/0542* (2013.01); *H03H 9/10* (2013.01); *H03H 9/1021* (2013.01); *H03H 9/19* (2013.01); *H01L 24/32* (2013.01); *H01L 24/45* (2013.01); *H01L 24/48* (2013.01); *H01L 24/49* (2013.01); *H01L 2224/32014* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48111* (2013.01); *H01L 2224/48195* (2013.01); *H01L 2224/48227* (2013.01); *H01L 2224/48245* (2013.01); *H01L 2224/49171* (2013.01); *H01L 2224/73265* (2013.01); *H01L 2224/83424* (2013.01); *H01L 2224/83439* (2013.01); *H01L 2224/83444* (2013.01);
  (Continued)

(58) Field of Classification Search
  CPC ............. H01L 23/49596; H01L 23/498; H01L 23/49513; H01L 23/48; H01L 24/45; H01L 24/32; H01L 24/48; H03B 9/0514; H03B 9/32; H03B 5/32; H03H 9/10; H03H 9/19; H03H 9/0542; H03H 9/0514
  See application file for complete search history.

(56) References Cited

U.S. PATENT DOCUMENTS

| | | | |
|---|---|---|---|
| 2005/0184626 A1* | 8/2005 | Chiba | H03H 9/0547 310/348 |
| 2014/0152392 A1 | 6/2014 | Owaki et al. | |
| 2016/0065170 A1* | 3/2016 | Takebayashi | H03H 9/131 331/158 |

FOREIGN PATENT DOCUMENTS

JP    2014-107862 A    6/2014

* cited by examiner

Primary Examiner — Hoa B Trinh
(74) Attorney, Agent, or Firm — Oliff PLC

(57) ABSTRACT

A vibrator device has a base that has a first terminal, a circuit element that is disposed on the base and has a second terminal, a vibrator that includes a vibrator element and a vibrator element package, and is positioned between the first terminal and the second terminal in plan view of the base, a wiring unit that is disposed on the vibrator, a first wire that electrically connects the first terminal and the wiring unit together, and a second wire that electrically connects the wiring unit and the second terminal together.

13 Claims, 15 Drawing Sheets

(51) Int. Cl.
*H03H 9/10* (2006.01)
*H03H 9/05* (2006.01)
*H03H 9/19* (2006.01)
H03B 1/02 (2006.01)
H01L 23/00 (2006.01)

(52) U.S. Cl.
CPC .............. *H01L 2224/83447* (2013.01); *H01L 2224/83455* (2013.01); *H01L 2224/83464* (2013.01); *H01L 2224/83466* (2013.01); *H01L 2224/83469* (2013.01); *H01L 2224/83478* (2013.01); *H01L 2224/83484* (2013.01); *H01L 2924/19107* (2013.01); *H01L 2924/3025* (2013.01); *H03B 1/02* (2013.01); *H05K 2203/049* (2013.01)

VIBRATOR DEVICE, OSCILLATOR, ELECTRONIC DEVICE, AND VEHICLE

BACKGROUND

1. Technical Field

The present invention relates to a vibrator device, an oscillator, an electronic device, and a vehicle.

2. Related Art

For example, an oscillator, which has a package having a terminal, a vibrator and a circuit element (IC) that are accommodated in the package, a wire that electrically connects the vibrator and the circuit element together, and a wire that electrically connects the terminal of the package and the circuit element together and in which the vibrator and the circuit element are disposed so as to be horizontally arranged, is disclosed in JP-A-2014-107862.

In the oscillator of JP-A-2014-107862, the vibrator is not disposed between the terminal of the package and the circuit element. For this reason, the disposition of the wire that electrically connects the terminal and the circuit element together is not disturbed due to the vibrator. However, a case where the vibrator is positioned between the terminal of the package and the terminal of the circuit element connected to the terminal of the package is also assumed depending on a configuration of the oscillator. In such a case, there is a possibility that the wire that electrically connects the terminal of the package and the terminal of the circuit element together interferes with the vibrator provided therebetween. In addition, there is also a possibility that a device configuration becomes complicated as the shape of the wire for preventing the interference becomes complicated or an increase in the size of the oscillator is caused by increasing the height of the wire.

SUMMARY

An advantage of some aspects of the invention is to provide a vibrator device, an oscillator, an electronic device, and a vehicle, in which a terminal of a package and a terminal of a circuit element can be electrically connected to each other easily even in a case where a vibrator is disposed between the terminal of the package and the terminal of the circuit element.

The advantage can be achieved by the following configurations.

A vibrator device according to an aspect of the invention includes a base that has a first terminal, a circuit element that is disposed on the base and has a second terminal, a vibrator that includes a vibrator element and a vibrator element package, and is positioned between the first terminal and the second terminal in plan view of the base, a wiring unit that is disposed on the vibrator, a first wire that electrically connects the first terminal and the wiring unit together, and a second wire that electrically connects the wiring unit and the second terminal together.

With this configuration, the first terminal and the second terminal can be electrically connected to each other easily.

In the vibrator device according the aspect of the invention, it is preferable that the vibrator is disposed on the base so as not to overlap the circuit element in the plan view of the base.

With this configuration, the height of the vibrator device can be made low.

In the vibrator device according to the aspect of the invention, it is preferable that the vibrator element package has a base body, in which the vibrator element is disposed, and a lid, which is bonded to the base body so as to accommodate the vibrator element between the lid and the base body, and is disposed such that the lid faces a base side, a third terminal electrically connected to the vibrator element is disposed on a surface of the base body on a side opposite to the base side, the plurality of second terminals are disposed, and the vibrator device further includes a third wire that electrically connects a second terminal that is not electrically connected to the wiring unit, out of the plurality of second terminals, and the third terminal together.

With this configuration, it is easy to electrically connect the circuit element and the vibrator together.

In the vibrator device according to the aspect of the invention, it is preferable that the base body has a base portion and a frame-like side wall portion stretching from the base portion, and at least one of a connecting portion between the wiring unit and the third wire and a connecting portion between the third terminal and the third wire overlaps the side wall portion in the plan view of the base.

With this configuration, by the side wall portion supporting from below when connecting the third wire to the wiring unit and the third terminal, the third terminal can push a capillary more strongly and ultrasonic waves can be more efficiently applied to the third terminal. For this reason, the third wire and the third terminal can be more firmly connected to each other.

In the vibrator device according to the aspect of the invention, it is preferable that the two third terminals are provided and are disposed as a pair of the third terminals, a center of the surface is positioned between the pair of third terminals, and the wiring unit is provided between the pair of third terminals.

With this configuration, the pair of third terminals can be disposed so as to be spaced apart from each other, and thus a bigger space for disposing the wiring unit can be ensured between the third terminals.

In the vibrator device according to the aspect of the invention, it is preferable that the wiring unit has a substrate disposed on the vibrator element package and wiring provided on the substrate.

With this configuration, the configuration of the wiring unit is simple.

In the vibrator device according to the aspect of the invention, it is preferable that a power supply voltage or a reference potential is applied to the first terminal.

With this configuration, the wiring unit can function as a shield layer, and thus the vibrator can be protected from disturbance.

In the vibrator device according to the aspect of the invention, it is preferable that the base is in a quadrilateral shape having a first side, a second side, a third side, and a fourth side in the plan view of the base, and the plurality of terminals, including the first terminal, are arranged along the first side, the second side, the third side, and the fourth side.

With this configuration, the perimeter of the base can be effectively used and a larger number of first terminals can be arranged.

In the vibrator device according to the aspect of the invention, it is preferable that a thickness of the vibrator is greater than a thickness of the circuit element.

With this configuration, the effect of the vibrator device described above is more conspicuous.

In the vibrator device according to the aspect of the invention, it is preferable that a mold portion that is provided on the base and covers the circuit element and the vibrator is further included.

With this configuration, the circuit element and the vibrator can be protected from moisture, dust, and shock, and thus the reliability of the vibrator device improves.

A vibrator device according to an aspect of the invention includes a base that has a first terminal, a circuit element that has a second terminal electrically connected to the first terminal, and a vibrator on which a wiring unit is disposed. The first terminal and the second terminal are electrically connected to each other via the wiring unit.

With this configuration, the vibrator device can demonstrate high reliability and can achieve miniaturization (low height).

An oscillator according to an aspect of the invention includes the vibrator device according to the aspect of the invention.

With this configuration, the oscillator, in which an effect of the vibrator device according to the aspect of the invention can be enjoyed and which has high reliability, is obtained.

An electronic device according to an aspect of the invention includes the vibrator device according to the aspect of the invention.

With this configuration, the electronic device, in which an effect of the vibrator device according to the aspect of the invention can be enjoyed and which has high reliability, is obtained.

A vehicle according to an aspect of the invention includes the vibrator device according to the aspect of the invention.

With this configuration, the vehicle, in which an effect of the vibrator device according to the aspect of the invention can be enjoyed and which has high reliability, is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator device, an oscillator, an electronic device, and a vehicle according to the invention will be described in detail based on embodiments illustrated in the attached drawings.

First Embodiment

First, an oscillator (vibrator device) according to a first embodiment of the invention will be described.

Figure 1:
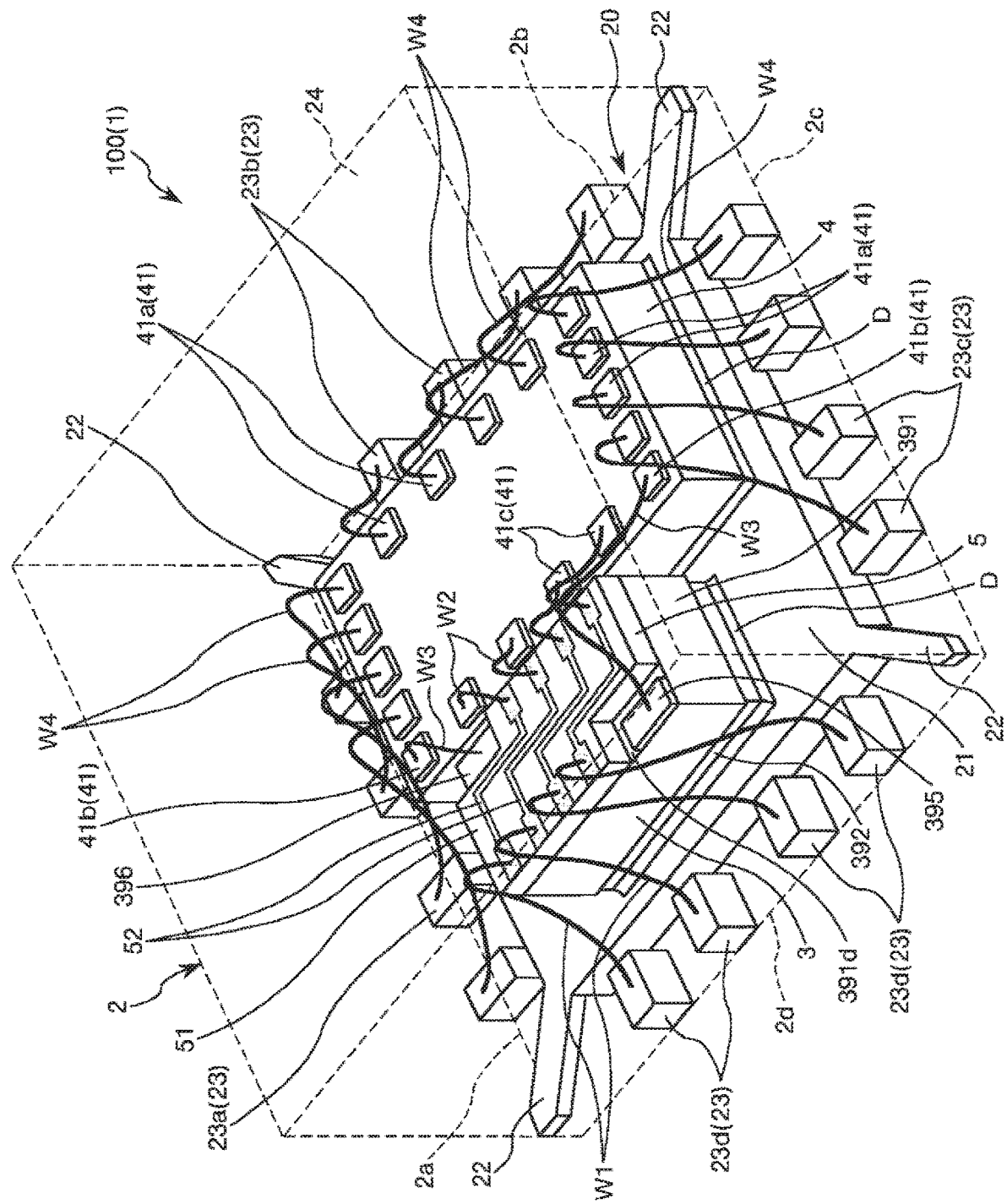
FIG. 1 is a perspective view illustrating an oscillator (vibrator device) according to a first embodiment of the invention.
Figure 2:
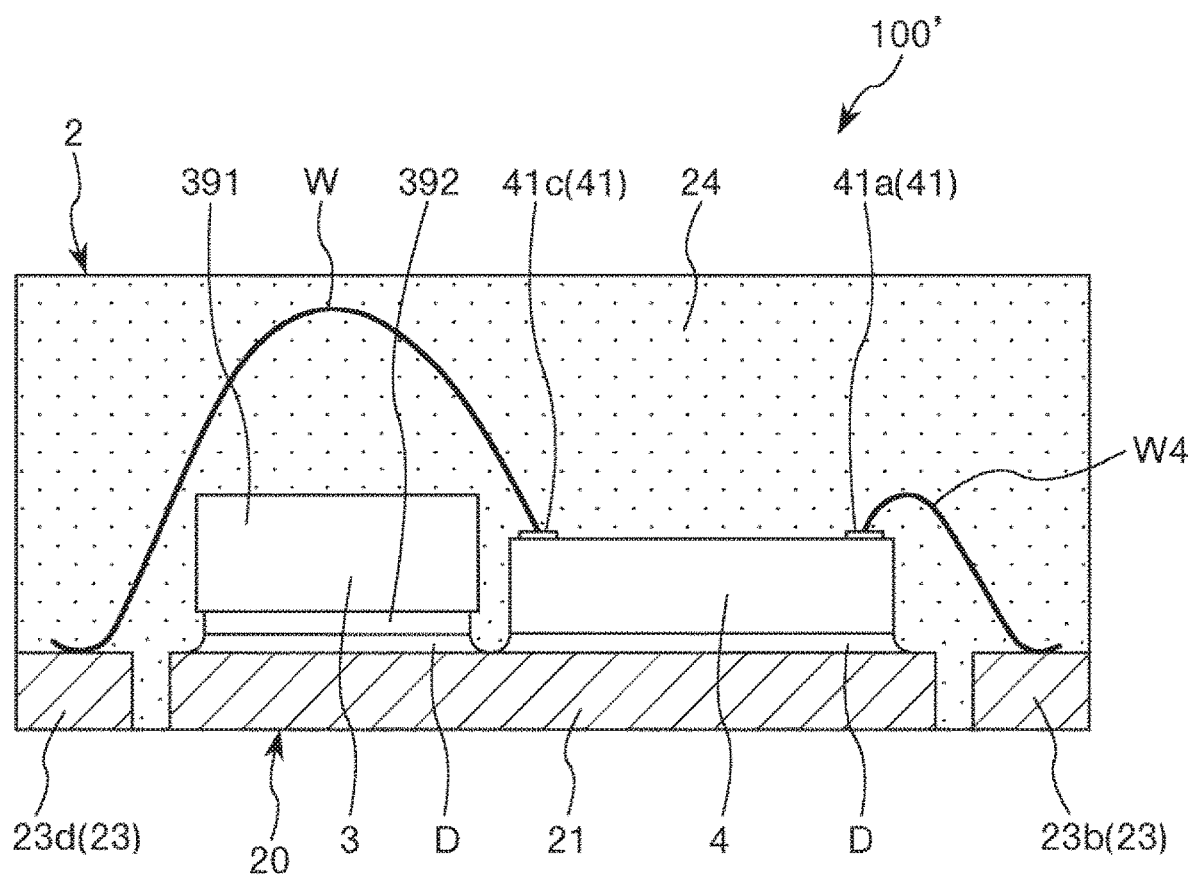
FIG. 2 is a sectional view illustrating an oscillator of the related art.
Figure 3:
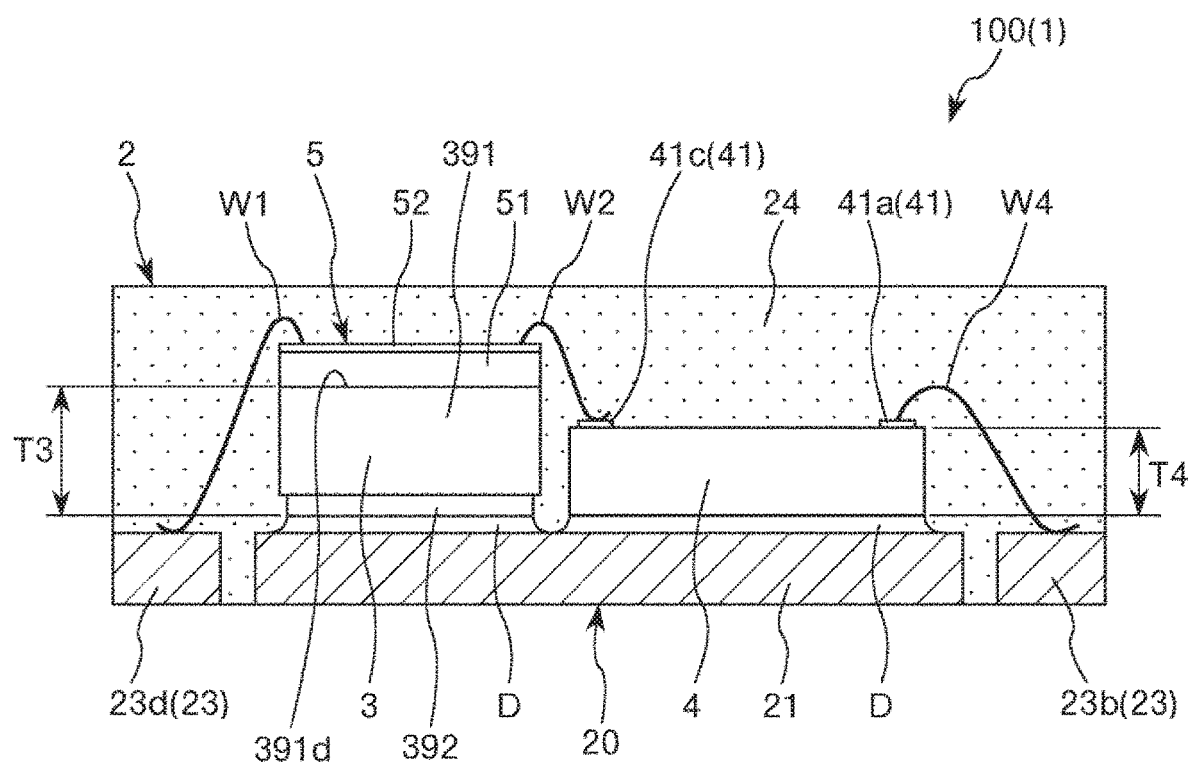
FIG. 3 is a sectional view of the oscillator illustrated in FIG. 1.
Figure 4:
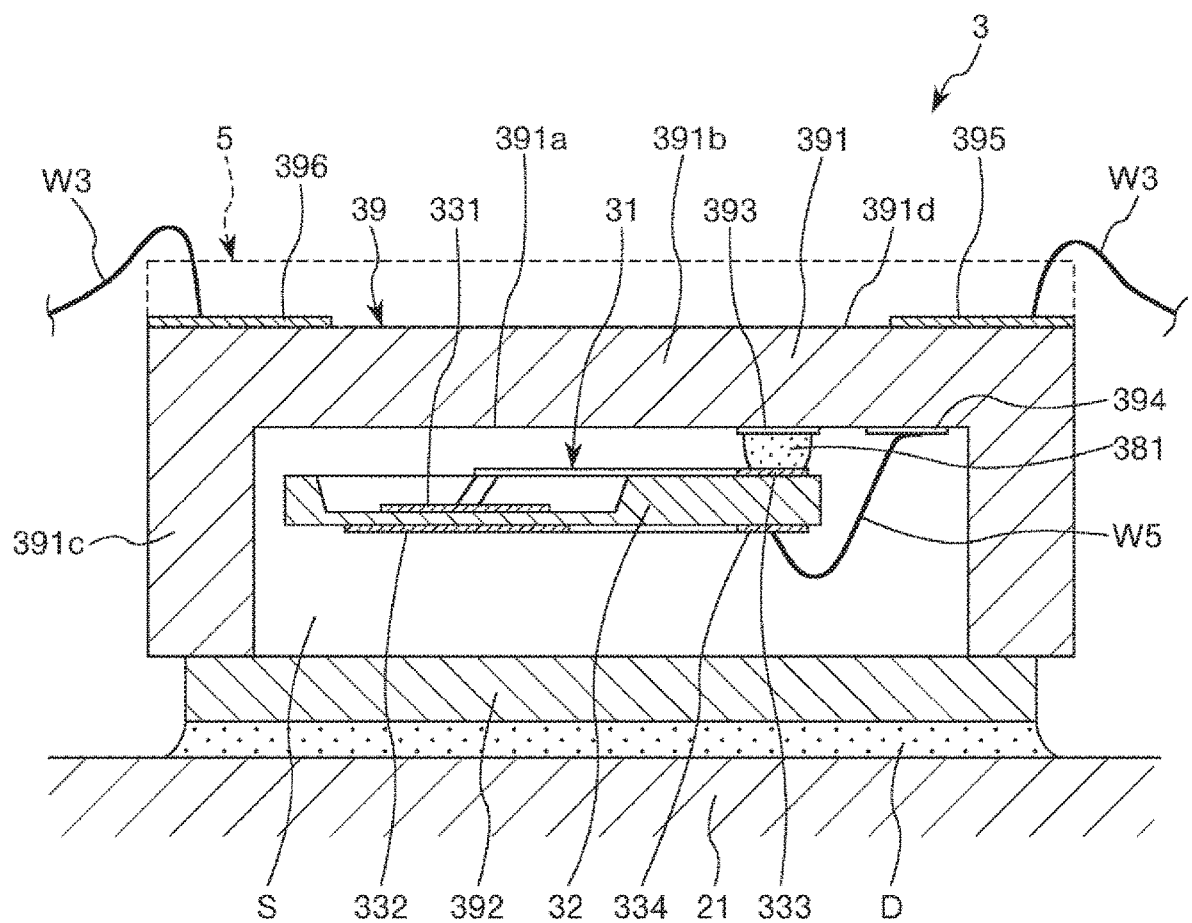
FIG. 4 is a sectional view of a vibrator of the oscillator illustrated in FIG. 1.
Figure 5:
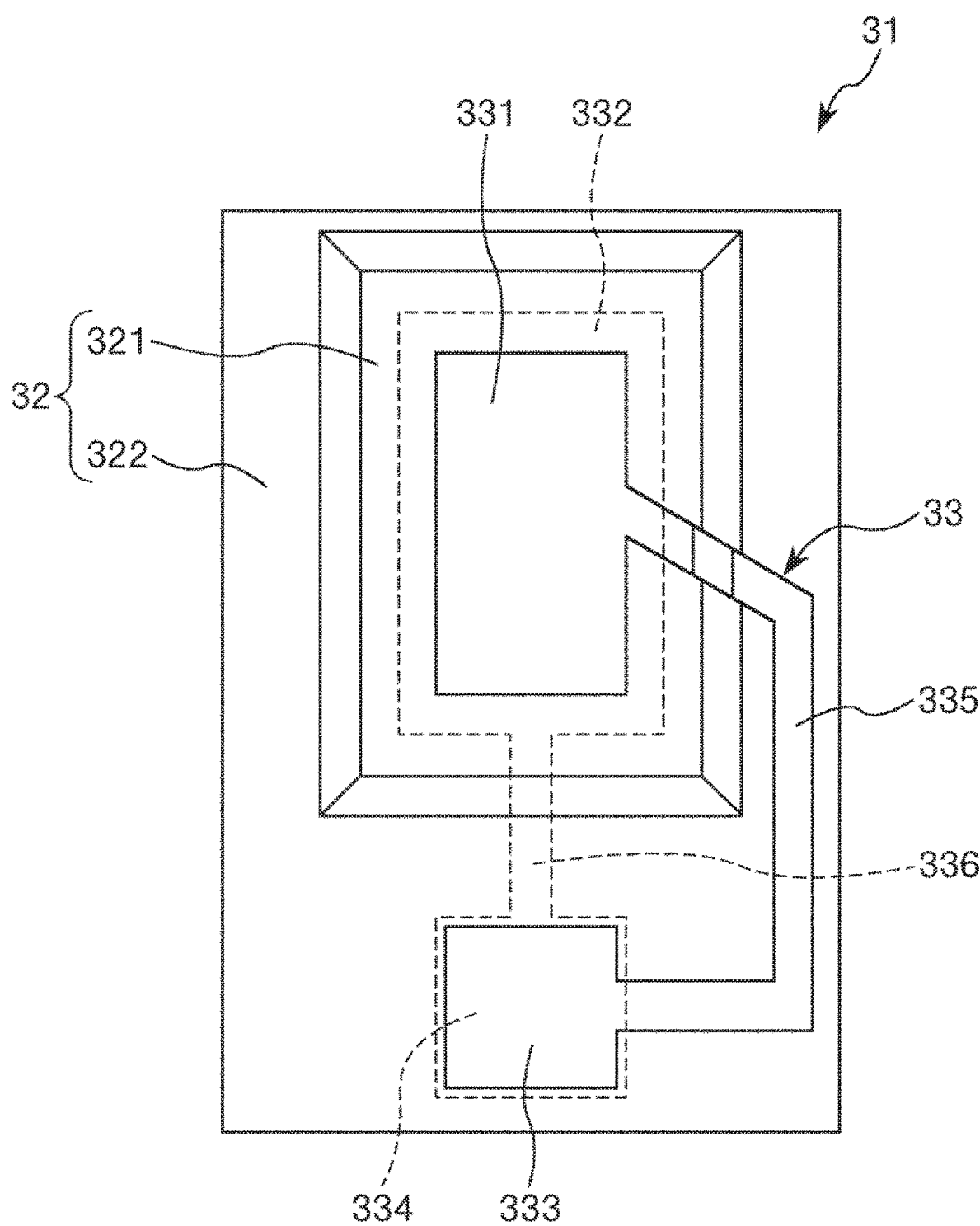
FIG. 5 is a plan view of a vibrator element of the vibrator illustrated in FIG. 4.
Figure 6:
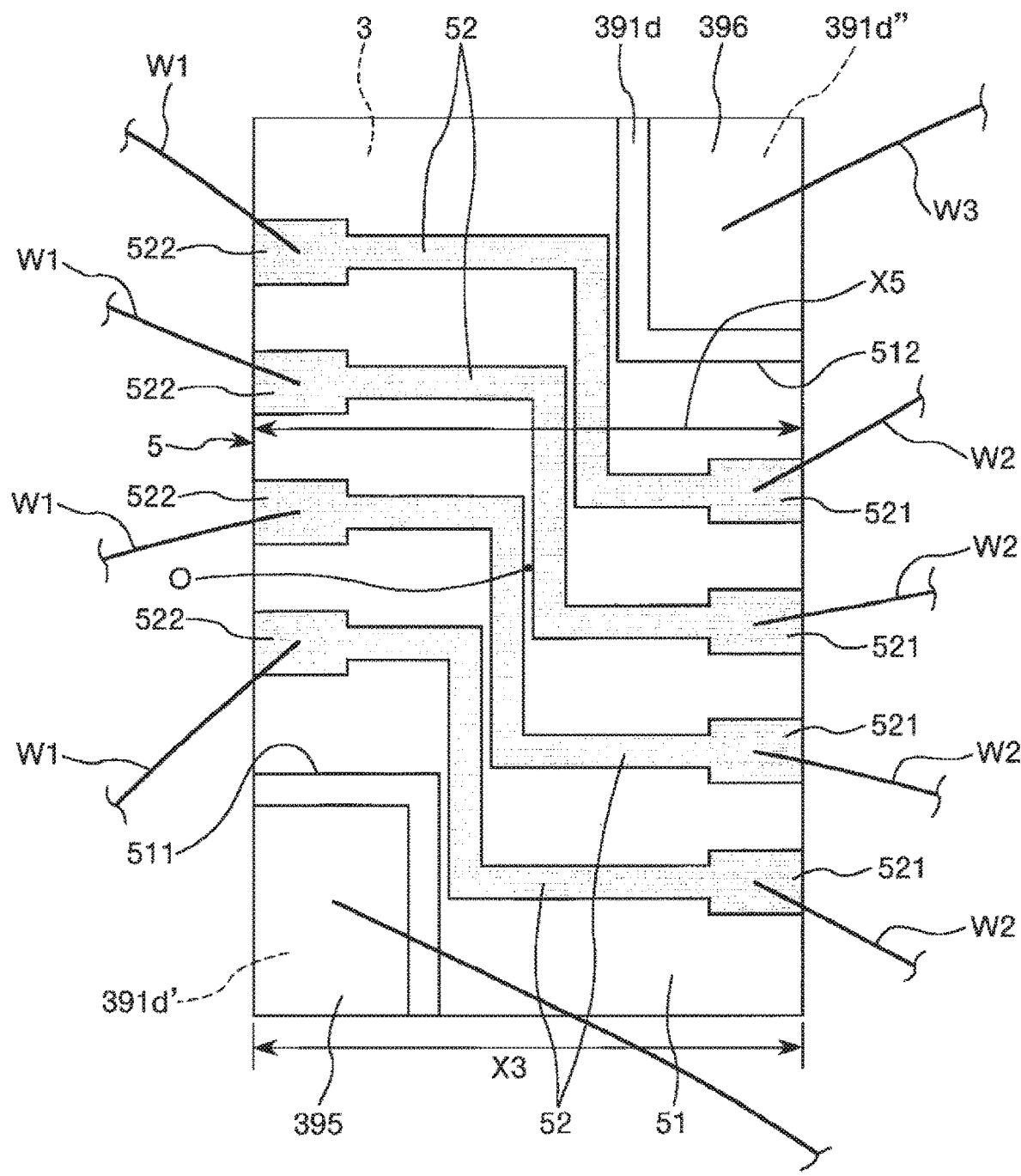
FIG. 6 is a plan view of the vibrator illustrated in FIG. 4.
Figure 7:
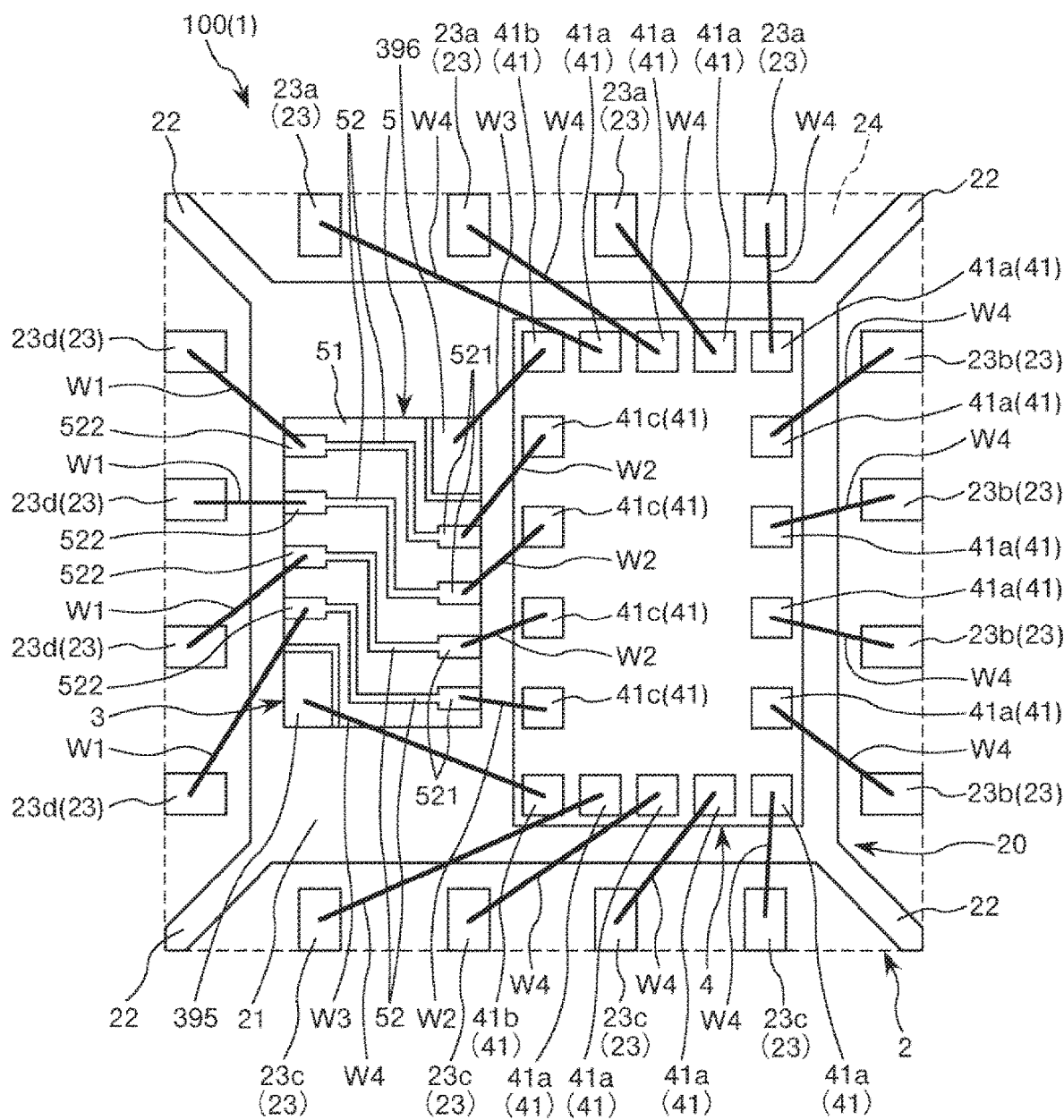
FIG. 7 is a plan view of the oscillator illustrated in FIG. 1.
Figure 8:
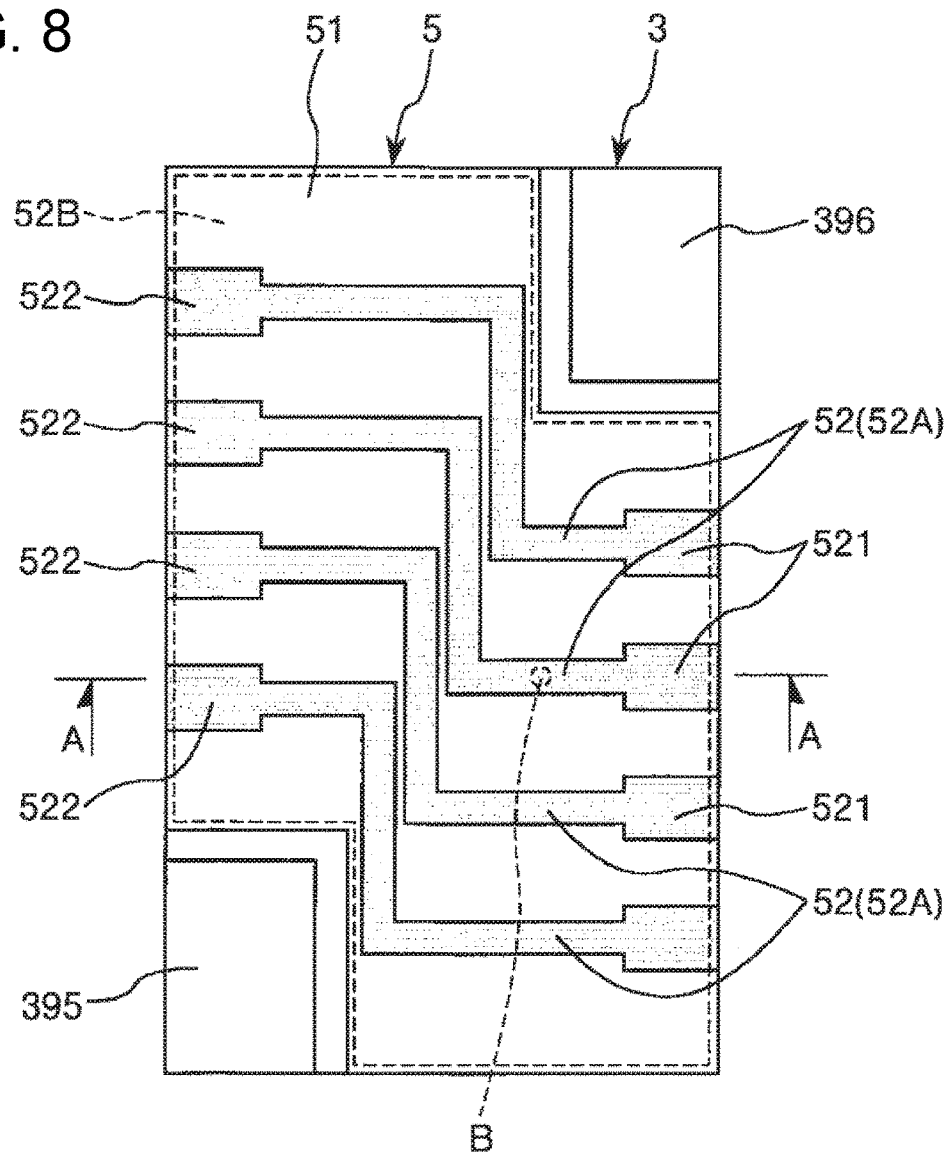
FIG. 8 is a plan view illustrating a modification example of a relay substrate of the oscillator illustrated in FIG. 1.
Figure 9:
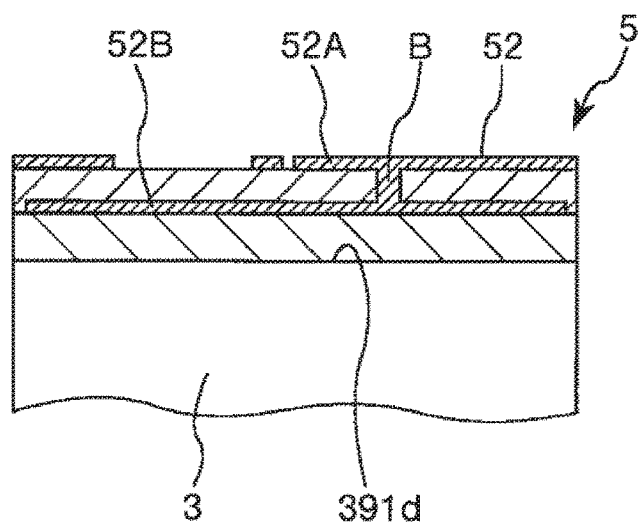
FIG. 9 is a sectional view taken along a line A-A in FIG. 8.
Figure 10:
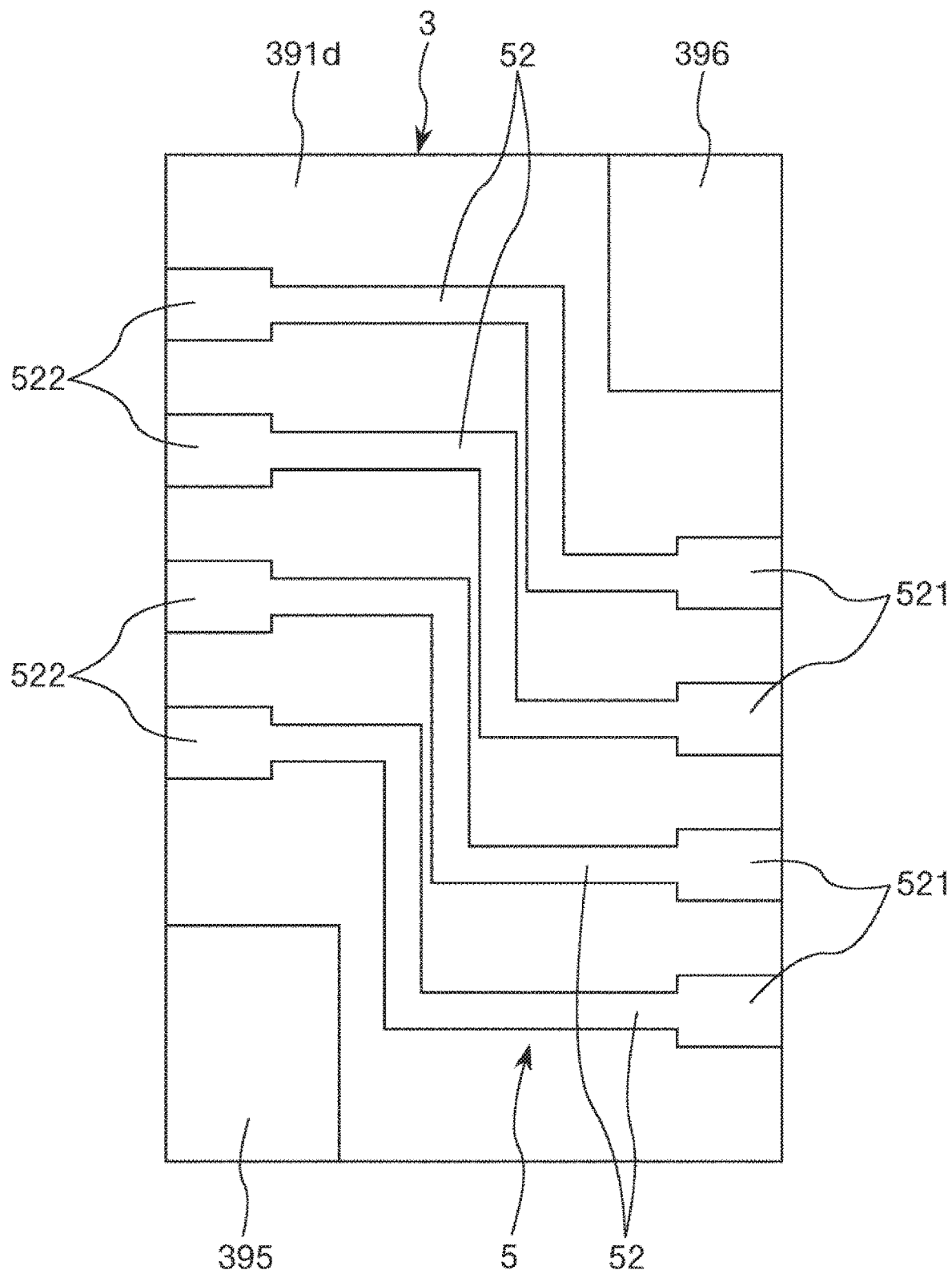
FIG. 10 is a plan view illustrating another modification example of the relay substrate of the oscillator illustrated in FIG. 1.

FIG. 1 is a perspective view illustrating the oscillator (vibrator device) according to the first embodiment of the invention. FIG. 2 is a sectional view illustrating an oscillator of the related art. FIG. 3 is a sectional view of the oscillator illustrated in FIG. 1. FIG. 4 is a sectional view of a vibrator of the oscillator illustrated in FIG. 1. FIG. 5 is a plan view of a vibrator element of the vibrator illustrated in FIG. 4. FIG. 6 is a plan view of the vibrator illustrated in FIG. 4. FIG. 7 is a plan view of the oscillator illustrated in FIG. 1. FIG. 8 is a plan view illustrating a modification example of a relay substrate of the oscillator illustrated in FIG. 1. FIG. 9 is a sectional view taken along a line A-A in FIG. 8. FIG. 10 is a plan view illustrating another modification example of the relay substrate of the oscillator illustrated in FIG. 1. Hereinafter, for convenience of description, an upper side in FIGS. 1, 2, 3, 4, and 9 and a page front side in FIGS. 5, 6, 7, 8, and 10 will also be referred to as "up", and a lower side in FIGS. 1, 2, 3, 4, and 9 and a page depth side of FIGS. 5, 6, 7, 8, and 10 will also be referred to as "down".

A vibrator device 1 illustrated in FIG. 1 is applied to an oscillator 100, and mainly has a package 2, a vibrator 3, a circuit element 4 (IC), and a relay substrate 5 (wiring unit). When directly connecting terminals 41c and leads 23d together with wires W in a structure where the vibrator 3 is positioned between the leads 23d (first terminals) of the package 2 and the terminals 41c (second terminals) of the circuit element 4 as in an oscillator 100' of the related art illustrated in FIG. 2, it is necessary to dispose the wires W so as to straddle the vibrator 3. Thus, the wires W interfere with the vibrator 3, or conversely, the wires W are provided excessively high in order to avoid the interference. Thus, in the oscillator 100, the relay substrate 5 is disposed on the vibrator 3, the terminals 41c and the relay substrate 5 are connected together with second wires W2, and the relay substrate 5 and the leads 23d are connected together with separate first wires W1, as illustrated in FIGS. 1 and 3. Consequently, the terminals 41c and the leads 23d can be electrically connected to each other without arranging the wires W straddling the vibrator 3 as illustrated in FIG. 2. Accordingly, interference between the first and second wires W1 and W2 and the vibrator 3 can be suppressed, and thus the terminals 41c and the leads 23d can be electrically connected to each other easily. In addition, the height of the oscillator 100 can also be made low since the heights of the first and second wires W1 and W2 can be restricted to be low compared to a configuration illustrated in FIG. 2. Hereinafter, such an oscillator 100 (vibrator device 1) will be described in detail.

Package

The package 2 is a quad flat non-leaded (QFN) package, and is in a substantially quadrilateral block shape (plate shape) in plan view. Such a package 2 has a base 20 and a mold portion 24 (sealing portion) as illustrated in FIGS. 1 and 3. The base 20 has a die pad 21 (mounting portion) having a substantially quadrilateral plate shape in plan view, four hanging leads 22 connected to corners of the die pad 21, and the plurality of leads 23 (first terminals) arranged along the perimeter of the die pad 21. However, the configuration of the base 20 is not particularly limited. For example, the die pad 21 may not be a substantially quadrangle in plan view.

As illustrated in FIGS. 1 and 3, each of the vibrator 3 and the circuit element 4 is bonded and fixed to the top surface of the die pad 21 via each die attach member D. The relay substrate 5 is bonded and fixed to a top surface 391d of the vibrator 3 via the die attach member D. In addition, the relay substrate 5 and the leads 23 (leads 23d to be described later) are electrically connected to each other via the first wires W1, the circuit element 4 and the relay substrate 5 are electrically connected to each other via the second wires W2, the vibrator 3 and the circuit element 4 are electrically connected to each other via third wires W3, and the circuit element 4 and the leads 23 (leads 23a, 23b, and 23c to be described later) are electrically connected to each other via fourth wires W4.

Each of the first, second, third, and fourth wires W1, W2, W3, and W4 is, for example, a bonding wire disposed (formed) using a wire bonding technique. Metal wires, for example, a gold wire, a copper wire, and an aluminum wire can be used as the first, second, third, and fourth wires W1, W2, W3, and W4.

The mold portion 24 is provided on the top surface of the base 20 so as to seal the vibrator 3, the circuit element 4, the relay substrate 5, and the first, second, third, and fourth wires W1, W2, W3, and W4. Consequently, each of the units can be effectively protected from moisture, dust, and shock, and thus the reliability of the oscillator 100 improves. The configuration materials of the mold portion 24 are not particularly limited. For example, an epoxy based thermosetting resin can be used and a thermosetting resin may contain a filler such as silica.

As illustrated in FIG. 1, each of the four hanging leads 22 extends from a corner of the die pad 21 to each corner of the package 2, and the die pad 21 is supported by the four hanging leads 22. Each of the hanging leads 22 is formed so as to be thinner than the die pad 21 by half etching a bottom surface thereof. The bottom surface of each of the hanging leads 22 is covered with the mold portion 24. Consequently, since each of the hanging leads 22 is not exposed from the bottom surface of the package 2, the mountability of the oscillator 100 improves.

As illustrated in FIG. 1, the plurality of leads 23 are arranged along four sides of the package 2 in plan view of the package 2. Specifically, the package 2 has a first side 2a, a second side 2b, a third side 2c, and a fourth side 2d in plan view. The plurality of leads 23 have the plurality of leads 23a arranged along the first side 2a, the plurality of leads 23b arranged along the second side 2b, the plurality of leads 23c arranged along the third side 2c, and the plurality of leads 23d arranged along the fourth side 2d. The number of the leads 23 arranged on each of the sides 2a, 2b, 2c, and 2d is not particularly limited, and can be changed as appropriate according to a device configuration. If at least one lead 23d is provided, a part of or all of the other leads 23 (23a, 23b, and 23c) may be omitted.

The bottom surface of each of the leads 23 (23a, 23b, 23c, and 23d) is exposed from the mold portion 24, and the leads are portions (connecting portions) that perform electrical connection with an external device. The top surface of each of the leads 23 is a portion (wire connecting portion) connected to the first wires W1 or the fourth wires W4.

The package 2 has been described hereinbefore. The configuration material of the base 20 is not particularly limited. Metal materials, such as gold (Au), silver (Ag), platinum (Pt), palladium (Pd), iridium (Ir), copper (Cu), aluminum (Al), nickel (Ni), titanium (Ti), and tungsten (W), and alloys including the metal materials can be given as examples, and out of the materials, one type or a combination (for example, as a stacked object having two or more layers) of two or more types of materials can be used. For example, by patterning one metal plate, the base 20 can be formed collectively with the die pad 21, each of the hanging leads 22, and each of the leads 23.

Vibrator

As illustrated in FIG. 4, the vibrator 3 has a vibrator element 31 and a vibrator element package 39 accommodating the vibrator element 31.

The vibrator element 31 is an AT cut quartz crystal vibrator element that thickness-shear vibrates. Such a vibrator element 31 has an AT cut quartz crystal substrate 32 and an electrode 33 formed on the quartz crystal substrate 32 as illustrated in FIG. 5. The quartz crystal substrate has a thin vibrating portion 321 and a thick portion 322, which is positioned on the perimeter of the vibrating portion 321 and is thicker than the vibrating portion 321. The thin vibrating portion 321 is formed by forming a recessed portion in one surface of the quartz crystal substrate 32.

The electrode 33 has a pair of excitation electrodes 331 and 332, a pair of pad electrodes 333 and 334, and a pair of extraction electrodes 335 and 336. The excitation electrode 331 is disposed on an exterior surface of the vibrating portion 321. On the other hand, the excitation electrode 332 is disposed on an interior surface of the vibrating portion 321 so as to oppose the excitation electrode 331. In such a configuration, a region of the vibrating portion 321 sandwiched between the excitation electrodes 331 and 332 is a vibration region where thickness-shear vibration is excited. The pad electrode 333 is disposed on an exterior surface of the thick portion 322, and the pad electrode 334 is disposed on an interior surface of the thick portion 322 so as to oppose the pad electrode 333. The extraction electrode 335 is disposed on an exterior surface of the quartz crystal substrate 32 and electrically connects the excitation electrode 331 and the pad electrode 333 together. The extraction electrode 336 is disposed on an interior surface of the quartz crystal substrate 32 and electrically connects the excitation electrode 332 and the pad electrode 334 together.

Although the vibrator element 31 has been briefly described hereinbefore, the configuration of the vibrator element 31 is not particularly limited. For example, the vibrator element may be a vibrator element using a quartz crystal substrate cut out at a different cut angle, such as a vibrator element using a Z cut quartz crystal substrate, a vibrator element using an ST cut quartz crystal substrate, and a vibrator element using an SC cut quartz crystal substrate. In addition, the vibrator element may be a vibrator element with a piezoelectric element being disposed on a silicon substrate, or may be a surface acoustic wave (SAW) vibrator with an inter digital transducer (IDT) being disposed on a silicon substrate.

As illustrated in FIG. 4, the vibrator element package 39 has a base body 391 and a lid 392. The base body 391 is in a box shape having a recess 391a which opens to the bottom surface. In other words, the base body 391 has a plate-like base portion 391b and a frame-like side wall portion 391c that stretches downwards from outer peripheral portions of the base portion 391b. The lid 392 is bonded to the bottom surface of the base body 391 so as to close an opening of the recess 391a. An accommodation space S is formed by closing the recess 391a with the lid 392 and the vibrator element 31 is accommodated in the accommodation space S. The accommodation space S is in, for example, a depressurized (vacuum) state. However, the atmosphere of the accommodation space S is not particularly limited, and can be changed as appropriate according to a configuration of the vibrator element 31.

Although the configuration material of the base body 391 is not particularly limited, various types of ceramics, for example, aluminum oxide, can be used. Although the configuration material of the lid 392 is not particularly limited, the configuration material may be, for example, a material of which linear expansion coefficient is similar to a linear expansion coefficient of the configuration material of the base body 391. For example, in a case where the configuration material of the base body 391 is the ceramic described above, it is preferable to be an alloy such as Kovar.

Internal terminals 393 and 394 are disposed on the bottom of the recess 391a and external terminals 395 and 396 (third terminals) are disposed on the top surface 391d of the base body 391. Via internal wiring (not illustrated) provided in the base body 391, the internal terminal 393 and the external terminal 395 are electrically connected to each other and the internal terminal 394 and the external terminal 396 are electrically connected to each other. Each of the external terminals 395 and 396 is electrically connected to the circuit element 4 via the third wires W3.

In particular, connecting portions between the relay substrate 5 and the external terminals 395 and 396 and the third wires W3 overlap the side wall portion 391c in plan view of the top surface 391d. In other words, immediately above the side wall portion 391c, the relay substrate 5 and the third wires W3 are connected to each other, and the external terminals 395 and 396 and the third wires W3 are connected to each other. Consequently, by the side wall portion 391c supporting from below when connecting the third wires W3 to the relay substrate 5 and the external terminals 395 and 396, the relay substrate 5 and the external terminals 395 and 396 can push a capillary more strongly and ultrasonic waves can be more efficiently applied to the external terminals 395 and 396. For this reason, the relay substrate 5 and the external terminals 395 and 396 and the third wires W3 can be more firmly connected to each other. However, the connecting portions between the relay substrate 5 and the external terminals 395 and 396 and the third wires W3 may not overlap the side wall portion 391c in plan view of the top surface 391d.

As illustrated in FIG. 6, the external terminals 395 and 396 are positioned on sides opposite to each other with respect to a center O of the top surface 391d in plan view of the top surface 391d. In particular, in the embodiment, the external terminal 395 is positioned on one corner 391d' of the top surface 391d, and the external terminal 396 is positioned on a corner 391d''', which is diagonally positioned with respect to the corner 391d' where the external terminal 395 is provided. By diagonally disposing the external terminals 395 and 396 on the top surface 391d as described above, the external terminals 395 and 396 can be disposed so as to be spaced further apart from each other. For this reason, a wider space for disposing the relay substrate 5 can be ensured between the external terminals 395 and 396. Since the disposition of such external terminals 395 and 396 is terminal disposition that is widely used in general, versatility increases (in particular, inspection using a probe pin to be described later is easy. That is because the disposition of the probe pin is determined in advance in accordance with the disposition of the terminals). However, the disposition of the external terminals 395 and 396 is not particularly limited. In addition, the number of the external terminals is not particularly limited as well, and can be set as appropriate according to a configuration of the vibrator element 31.

As illustrated in FIG. 4, the vibrator element 31 is disposed in the accommodation space S such that the exterior surface (surface on a side where the recessed portion is formed) of the vibrator element faces the base body 391. The vibrator element is fixed to the bottom of the recess 391a by a conductive adhesive 381, and the pad electrode 333 and the internal terminal 393 are electrically connected to each other via the conductive adhesive 381. The pad electrode 334 and the internal terminal 394 are electrically connected to each other via a fifth wire W5. Consequently, electrical connection between the outside of the vibrator element package 39 and the vibrator element 31 can be achieved via the external terminals 395 and 396.

Although the vibrator element package 39 has been described hereinbefore, the configuration of the vibrator element package 39 is not particularly limited. Contrary to the embodiment, for example, the base body 391 may be in a plate shape and the lid 392 may be in a cap shape having a recess (recess that corresponds to the recess 391a of the embodiment) accommodating the vibrator element 31.

With the lid 392 facing a die pad 21 side (lower side), the vibrator 3 having such a configuration is bonded and fixed to the top surface of the die pad 21, via the die attach member D as illustrated in FIG. 4. By disposing the vibrator 3 in such an orientation, the external terminals 395 and 396 can face the upper side (side opposite to the die pad 21). For this reason, it is easy to dispose (form) the third wires W3 that electrically connect the vibrator 3 and the circuit element 4 together. If, for example, a defective component is generated in the oscillator 100, in some cases, a probe pin for inspection is directly pushed against the external terminals 395 and 396 of the vibrator 3 and the vibrator element 31 is directly driven to perform inspection in order to find out a cause. In this case, if the external terminals 395 and 396 face upwards, the external terminals 395 and 396 can be easily exposed and the inspection described above can be easily performed by simply removing the mold portion 24 positioned above the external terminals 395 and 396 by etching.

Although the vibrator 3 has been described hereinbefore, the configuration of the vibrator 3 is not particularly limited. For example, the vibrator may be an MEMS chip.

Circuit Element

The circuit element 4 has, for example, an oscillation circuit for oscillating the vibrator element 31, and can output a signal having a predetermined frequency.

As illustrated in FIG. 1, such a circuit element 4 is bonded and fixed to the top surface of the die pad 21 via the die attach member D. The circuit element 4 is positioned on the die pad 21 so as not to overlap the vibrator 3. That is, the vibrator 3 and the circuit element 4 are disposed so as to be arranged in an in-plane direction of the die pad 21, and the circuit element 4 is positioned on the right side (side opposite to the leads 23*d*) of the vibrator 3 in FIG. 1 in the embodiment. By disposing the vibrator 3 and the circuit element 4 so as to be arranged in the in-plane direction of the die pad 21 as described above, the height of the oscillator 100 can be made low.

In addition, the top surface of the circuit element 4 is an active surface, and the circuit element has a plurality of terminals 41 arranged on the active surface. The terminals 41 have terminals 41*a* connected to the leads 23*a*, 23*b*, and 23*c* via the fourth wires W4, terminals 41*b* connected to the vibrator 3 via the third wires W3, and the terminals 41*c* connected to the relay substrate 5 via the second wires W2.

As illustrated in FIG. 3, a thickness T4 (height in a thickness direction of the base 20) of the circuit element 4 is smaller than a thickness T3 of the vibrator 3 (that is, T4<T3), and the top surface of the circuit element 4 is positioned below (on the die pad 21 side) the top surface of the vibrator 3. For this reason, for example, in the configuration of FIG. 2 described above, the wires W are more likely to interfere with the vibrator 3, or conversely, the wires W are provided excessively high in order to avoid the interference. That is, an effect of using the relay substrate 5 is more conspicuous. A ratio between the thicknesses T3 and T4 is not particularly limited. The ratio is preferably $1.2 \leq T3/T4 \leq 3.0$, more preferably $1.2 \leq T3/T4 \leq 2.0$. Consequently, the effect described above can be more effectively demonstrated while suppressing an excessive increase in the size (increase in the height) of the oscillator 100 due to the thickness T3 of the vibrator 3. However, a relationship between the thicknesses T3 and T4 is not particularly limited. For example, the relationship may be T3=T4 or may be T4>T3.

Relay Substrate

As illustrated in FIGS. 1 and 6, the relay substrate 5 has a substrate 51 and a plurality of (four) wiring pieces 52 provided on the substrate 51. Such a relay substrate 5 is not particularly limited. For example, various types of print wiring substrates such as a rigid wiring substrate, a flexible wiring substrate, and a rigid flexible wiring substrate can be used. Consequently, the configuration of the relay substrate 5 is simple. Although the relay substrate 5 has the four wiring pieces 52 in the embodiment, the number of the wiring pieces 52 is not particularly limited. The number may be one to three, or may be five or more.

Such a relay substrate 5 is bonded and fixed to the top surface (the top surface 391*d* of the base body 391) of the vibrator 3 via the die attach member D. The relay substrate 5 is provided so as not to cover up the external terminals 395 and 396 (in particular, connecting portions with the third wires W3). As described above, the external terminals 395 and 396 are diagonally positioned on the top surface 391*d*, and the relay substrate 5 is provided between the external terminals 395 and 396. The relay substrate 5 has cut-out portions 511 and 512 at portions overlapping the external terminals 395 and 396, and the external terminals 395 and 396 are exposed from the cut-out portions 511 and 512. Since the external terminals 395 and 396 are diagonally positioned on the top surface 391*d*, a bigger space for disposing the relay substrate 5 can be ensured between the external terminals 395 and 396.

Each of the plurality of wiring pieces 52 extends to a circuit element 4 side (right side in FIG. 6) and to a lead 23*d* side (left side in FIG. 6). Each of end portions 521 of the wiring pieces 52 on the circuit element 4 side is electrically connected to each of the terminals 41*c* of the circuit element 4 via each of the second wires W2, and each of end portions 522 on the lead 23*d* side is electrically connected to each of the leads 23*d* via each of the first wires W1. Consequently, it is even more difficult for the first wires W1 and the second wires W2 to interfere with the vibrator 3, and the heights of the first wires W1 and the second wires W2 can be more effectively restricted to be low.

In particular, in the embodiment, a width X5 of the relay substrate 5 is almost equal to a width X3 of the top surface 391*d* of the vibrator 3, and each of the end portions 521 and 522 of each of the wiring pieces 52 can be arranged on edges (points even closer to the outline) of the top surface 391*d*. For this reason, it is even more difficult for the first wires W1 and the second wires W2 to interfere with the vibrator 3, and the heights of the first wires W1 and the second wires W2 can be more effectively restricted to be low. A ratio between the widths X5 and X3 is not particularly limited. For example, the ratio is preferably $0.8 \leq X5/X3 \leq 1.0$, more preferably $0.9 \leq X5/X3 \leq 1.0$. Consequently, the effect described above is more conspicuous.

It is preferable that at least one lead, out of the plurality of leads 23*d*, is a terminal of the circuit element 4, to which a power supply voltage or a reference potential (for example, ground) is applied. Consequently, the wiring pieces 52 can function as shield layers (electromagnetic shield), and thus the vibrator 3 can be effectively protected from disturbance.

The package 2, the vibrator 3, the circuit element 4, and the relay substrate 5 have been described hereinbefore. Next, electrical connection therebetween will be described. As illustrated in FIG. 7, each of the plurality of terminals 41*a* of the circuit element 4 is electrically connected to any one of the leads 23*a*, 23*b*, and 23*c* via each of the fourth wires W4. Consequently, the circuit element 4 and the leads 23*a*, 23*b*, and 23*c* can be electrically connected to each other easily. Each of the plurality of terminals 41*b* of the circuit element 4 is electrically connected to each of the external terminals 395 and 396 of the vibrator 3 via each of the third wires W3. Consequently, the circuit element 4 and the vibrator 3 can be electrically connected to each other easily. The plurality of terminals 41*c* of the circuit element 4 are electrically connected to the wiring pieces 52 (end portions 521) of the relay substrate 5 via the second wires W2. Each of the wiring pieces 52 (end portions 522) of the relay substrate 5 is electrically connected to each of the leads 23*d* via each of the first wires W1.

A problem, which occurs in the configuration illustrated in FIG. 2 described above, can be effectively eased by connecting the leads 23*d*, which are provided such that the vibrator 3 is positioned between the circuit element 4 (terminals 41) and the leads, via the relay substrate 5 disposed on the vibrator 3, instead of directly connecting to the terminals 41 via one wire. That is, it is difficult for the first wires W1 and the second wires W2 to interfere with the vibrator 3, and the heights of the first wires W1 and the second wires W2 can be effectively restricted to be low. For this reason, the oscillator 100 (vibrator device 1) can demonstrate high reliability and can achieve miniaturization (low height).

On the other hand, the leads 23*a*, 23*b*, and 23*c*, which are provided such that the vibrator 3 is not positioned between the circuit element 4 (terminals 41) and the leads, are electrically connected to the terminals 41*a* of the circuit element 4 via one fourth wire W4. Consequently, connection therebetween is easy, and the miniaturization of the oscillator 100 can be achieved.

The oscillator 100 to which the vibrator device 1 is applied has been described hereinbefore. As described above, such a vibrator device 1 (oscillator 100) includes the base 20 having the leads 23*d* (first terminals), the circuit element 4 having the terminals 41c (second terminals) electrically connected to the leads 23d, and the vibrator 3 on which the relay substrate 5 (wiring unit) is disposed. The leads 23d and the terminals 41c are electrically connected to each other via the relay substrate 5. More specifically, the vibrator device 1 has the base 20 having the leads 23d (first terminals), the circuit element 4 that is disposed on the base 20 and has the terminals 41c (second terminals), the vibrator 3 that is positioned between the leads 23d and the terminals 41c in plan view of the base 20 and includes the vibrator element 31 and the vibrator element package 39 accommodating the vibrator element 31, the relay substrate 5 (wiring unit) disposed on the vibrator 3, the first wires W1 that electrically connect the leads 23d and the relay substrate 5 together, and the second wires W2 that electrically connect the relay substrate 5 and the terminals 41c together. Consequently, since the leads 23d and the terminals 41c are electrically connected to each other by way of (relay) the relay substrate 5, the leads and the terminals can be electrically connected to each other easily. It is difficult for the first wires W1 and the second wires W2 to interfere with the vibrator 3, and the heights of the first wires W1 and the second wires W2 can be effectively restricted to be low. For this reason, the oscillator 100 (vibrator device 1) can demonstrate high reliability and can achieve miniaturization (low height).

As described above, the vibrator 3 is disposed on the base 20 without overlapping the circuit element 4 in plan view of the base 20. That is, the vibrator 3 and the circuit element 4 are disposed so as to be arranged in the in-plane direction of the die pad 21, so that the vibrator and the circuit element do not overlap each other. Consequently, the height of the oscillator 100 (vibrator device 1) can be made low.

As described above, the vibrator element package 39 has the base body 391, in which the vibrator element 31 is disposed, and the lid 392 bonded to the base body 391 so as to accommodate the vibrator element 31 between the lid and the base body 391, and the lid 392 is disposed so as to face the base 20 (die pad 21) side. The external terminals 395 and 396 (third terminals) electrically connected to the vibrator element 31 are disposed on the top surface 391d (surface on a side opposite to the base 20 side) of the base body 391. In addition, the plurality of terminals 41b are disposed. The oscillator 100 (vibrator device 1) has the third wires W3 that electrically connect terminals, which are not electrically connected to the relay substrate 5, out of the plurality of terminals 41b, and the external terminals 395 and 396 together. Consequently, it is easy to electrically connect the circuit element 4 and the vibrator 3 together.

As described above, the base body 391 has the base portion 391b and the frame-like side wall portion 391c stretching from the base portion 391b. At least one (both, in the embodiment) of the connecting portion between the relay substrate 5 and the third wire W3 and the connecting portion between the external terminals 395 and 396 and the third wire W3 overlaps the side wall portion 391c in plan view of the base 20. Consequently, by the side wall portion 391c supporting from below when connecting the third wires W3 to the relay substrate 5 and the external terminals 395 and 396, the relay substrate 5 and the external terminals 395 and 396 can push a capillary more strongly and ultrasonic waves can be more efficiently applied to the external terminals 395 and 396. For this reason, the third wires W3 and the external terminals 395 and 396 can be more firmly connected to each other.

As described above, the center O of the top surface 391d is positioned between the pair of external terminals 395 and 396, and the relay substrate 5 is provided between the pair of external terminals 395 and 396. Consequently, the external terminals 395 and 396 can be disposed so as to be spaced further apart from each other, and thus a bigger space for disposing the relay substrate 5 can be ensured between the external terminals.

As described above, the relay substrate 5 has the substrate 51 disposed on the vibrator element package 39 and the wiring pieces 52 provided on the substrate 51. Consequently, the configuration of the relay substrate 5 is simple.

As described above, a power supply voltage or a reference potential is applied to the leads 23d. Consequently, the wiring pieces 52 can function as shield layers (electromagnetic shield), and thus the vibrator 3 (vibrator element 31) can be protected from disturbance. As illustrated in FIGS. 8 and 9, for example, the relay substrate 5 can also adopt a layered configuration where a plurality of wiring layers 52A and 52B are provided. Each of the wiring pieces described above is formed from the wiring layer 52A positioned on the upper side, and the wiring layer 52B positioned on the lower side (vibrator 3 side) is set as a solid electrode while being connected to any one of the plurality of wiring pieces 52 via a via B. The leads 23 electrically connected to the wiring pieces 52, which are connected to the wiring layer 52B, are used as terminals to which a power supply voltage or a reference potential is applied. Consequently, the shielding effect described above can be more effectively demonstrated.

As described above, the thickness T3 of the vibrator 3 is greater than the thickness T4 of the circuit element 4. Consequently, an effect of using the relay substrate 5 described above is more conspicuous.

As described above, in plan view of the base 20, the base 20 is in a quadrilateral shape having the first side 2a, the second side 2b, the third side 2c, and the fourth side 2d, and the plurality of leads 23 (terminals) including the leads 23d (first terminal) are arranged along the first side 2a, the second side 2b, the third side 2c, and the fourth side 2d. Consequently, the perimeter of the base 20 can be effectively used and a larger number of leads 23 can be arranged.

As described above, the package 2 has the mold portion 24, which is disposed on the base 20 and covers the circuit element 4 and the vibrator 3. Consequently, the circuit element 4 and the vibrator 3 can be protected from moisture, dust, and shock, and thus the reliability of the oscillator 100 (vibrator device 1) improves.

As described above, the oscillator 100 has the vibrator device 1. For this reason, the effect of the vibrator device 1 described above can be enjoyed and high reliability can be demonstrated.

Although a configuration where the package 2 is a QFN package has been described in the embodiment, the package is not particularly limited insofar as the leads 23d (including the equivalents of the leads) are included. For example, a quad flat package (QFP), a dual flat package (DFP), a ball grid array (BGA), a small outline package (SOP), and a dual flat no-leaded (DFN) package may be used. In addition, for example, a ceramic package such as the vibrator element package 39 may be used.

Although the wiring unit is configured separately from the vibrator 3 as the relay substrate 5 in the embodiment, the wiring unit is not limited thereto. For example, the wiring unit may be integrated with the vibrator element package 39 as illustrated in FIG. 10. In this case, the wiring unit has the plurality of wiring pieces 52 arranged on the top surface 391d of the base body 391. Consequently, the height of the oscillator 100 can be made low by the thickness of the substrate 51, compared to the embodiment. The wiring pieces 52 can be formed collectively with the external terminals 395 and 396.

Second Embodiment

Next, an oscillator (vibrator device) according to a second embodiment of the invention will be described.

Figure 11:
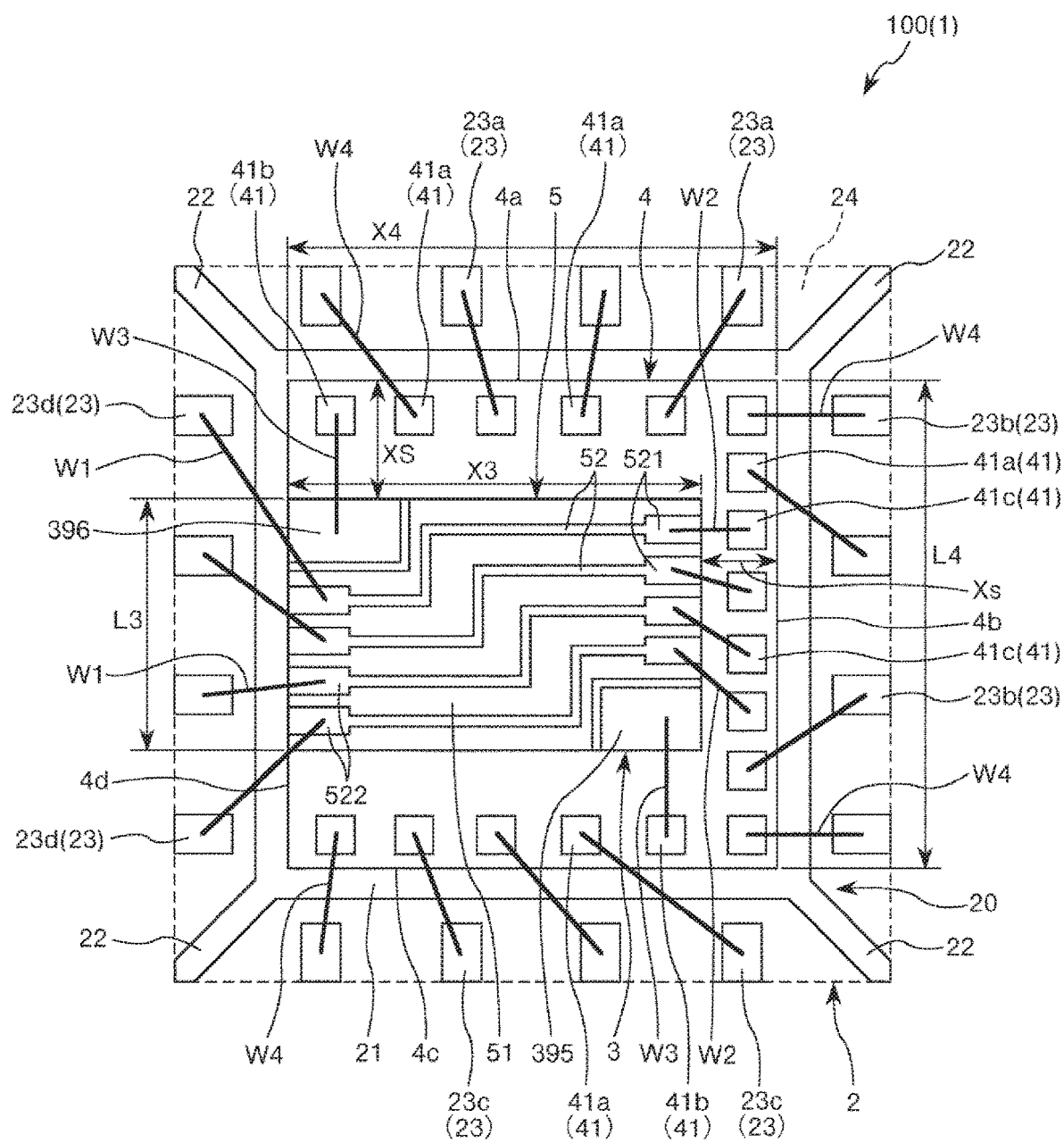
FIG. 11 is a plan view illustrating an oscillator (vibrator device) according to a second embodiment of the invention.
Figure 12:
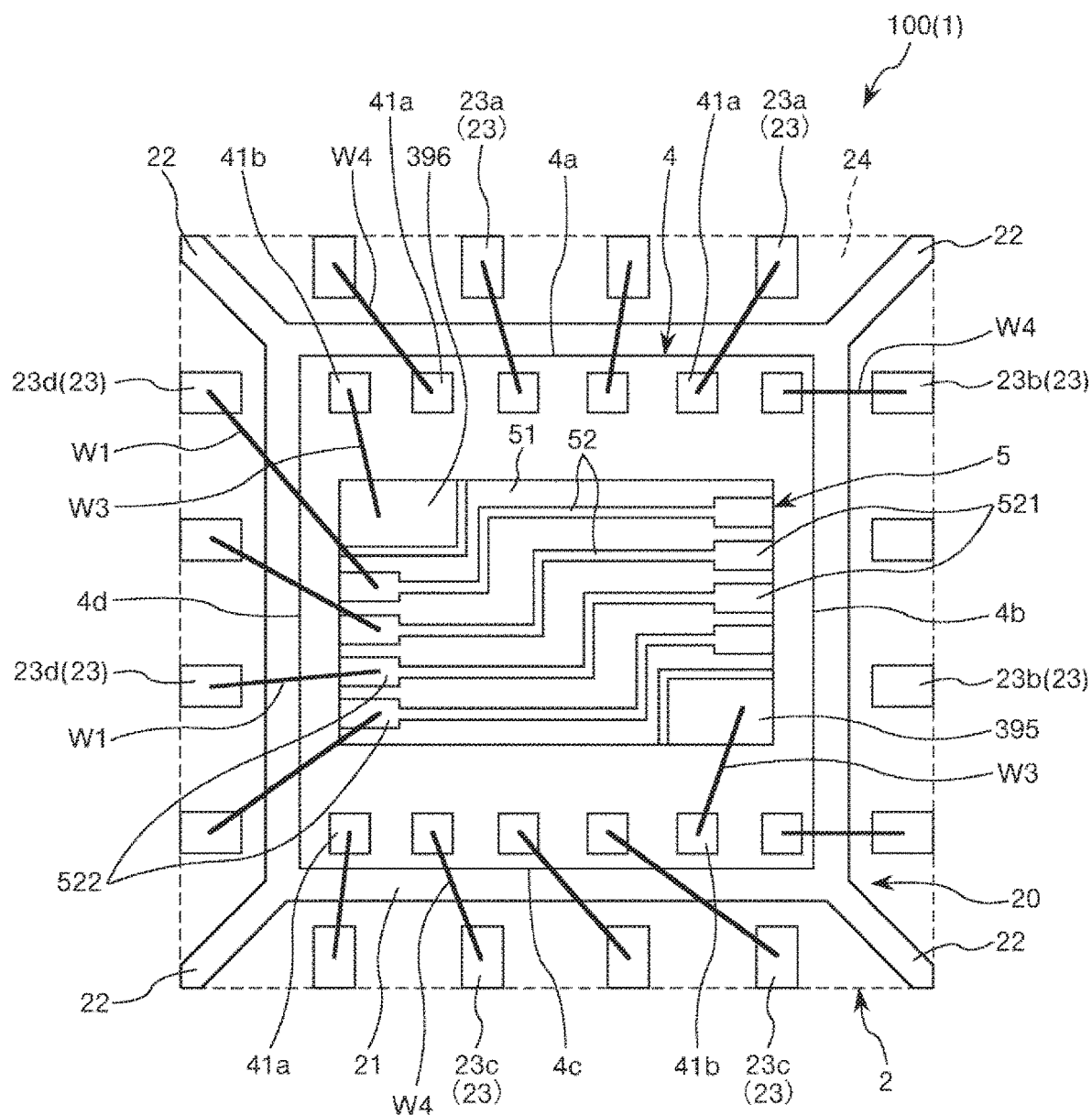
FIG. 12 is a plan view illustrating a modification example of the oscillator illustrated in FIG. 11.

FIG. 11 is a plan view illustrating the oscillator (vibrator device) according to the second embodiment of the invention. FIG. 12 is a plan view illustrating a modification example of the oscillator illustrated in FIG. 11.

Hereinafter, differences between the oscillator of the second embodiment and the oscillator of the first embodiment described above will be mainly described, and the description of the same facts will be omitted.

The oscillator of the second embodiment is mainly the same as the oscillator of the first embodiment described above except that the disposition of the vibrator 3 is different. In FIGS. 11 and 12, the same configuration as in the embodiment described above will be assigned with the same reference sign.

As illustrated in FIG. 11, in the oscillator 100 (vibrator device 1) of the embodiment, the vibrator 3 is disposed on the top surface of the circuit element 4. Consequently, the widening of the oscillator 100 in the in-plane direction can be restricted and the miniaturization of the oscillator 100 can be achieved, for example, compared to the first embodiment described above.

In the embodiment, the width X3 of the vibrator 3 is slightly smaller than a width X4 of the circuit element 4. A length L3 of the vibrator 3 is sufficiently smaller than a length L4 of the circuit element 4. The vibrator 3 is biasedly disposed on the left side (lead 23*d* side) of FIG. 11 with respect to the circuit element 4.

For example, in a case where the vibrator 3 is disposed such that the center of the vibrator matches the center of the circuit element on a middle portion of the circuit element 4 as illustrated in FIG. 12, a space for arranging the terminals 41 along the side 4*b* and the side 4*d* of the circuit element 4 cannot be ensured, and thus the terminals 41 can be arranged only along the sides 4*a* and 4*c*. For this reason, for example, in a case where the number of the terminals 41 is large and the circuit element 4 is relatively small, there is a possibility that not all of the terminals 41 can be arranged or an interval between the adjacent terminals 41 is narrow even when all of the terminals 41 can be arranged. FIG. 12 illustrates a case where a predetermined number of terminals 41 cannot be arranged, for convenience of description.

On the other hand, a space for arranging the terminals 41 along the side 4*b* can be ensured by disposing the vibrator 3 so as to be biased on the left side of FIG. 11 as in the embodiment. For this reason, the terminals 41 can be arranged along three sides (that is, the sides 4*a*, 4*b*, and 4*c*) of the circuit element 4, and thus a larger number of terminals 41 can be arranged compared to the configuration of FIG. 12. The interval between the adjacent terminals 41 can be sufficiently widened, and the second wires W2, the third wires W3, and the fourth wires W4 can be easily connected to the terminals 41. A short circuit caused by contact of the second, third, fourth wires W2, W3, and W4 can also be effectively suppressed. A space (width Xs) for arranging the terminals 41 is not particularly limited, and is preferably 300 μm or more, more preferably 500 μm or more.

In such a second embodiment, the same effect as in the first embodiment described above can be demonstrated. The configuration of FIG. 12 is for describing the effect of the embodiment such that the effect is easily understood, and is not to deny the adoption of the configuration illustrated in FIG. 12. That is, in a case where there is no problem in the space for arranging the terminals 41, the configuration illustrated in FIG. 12 may be adopted.

Third Embodiment

Next, an electronic device according to a third embodiment of the invention will be described.

Figure 13:
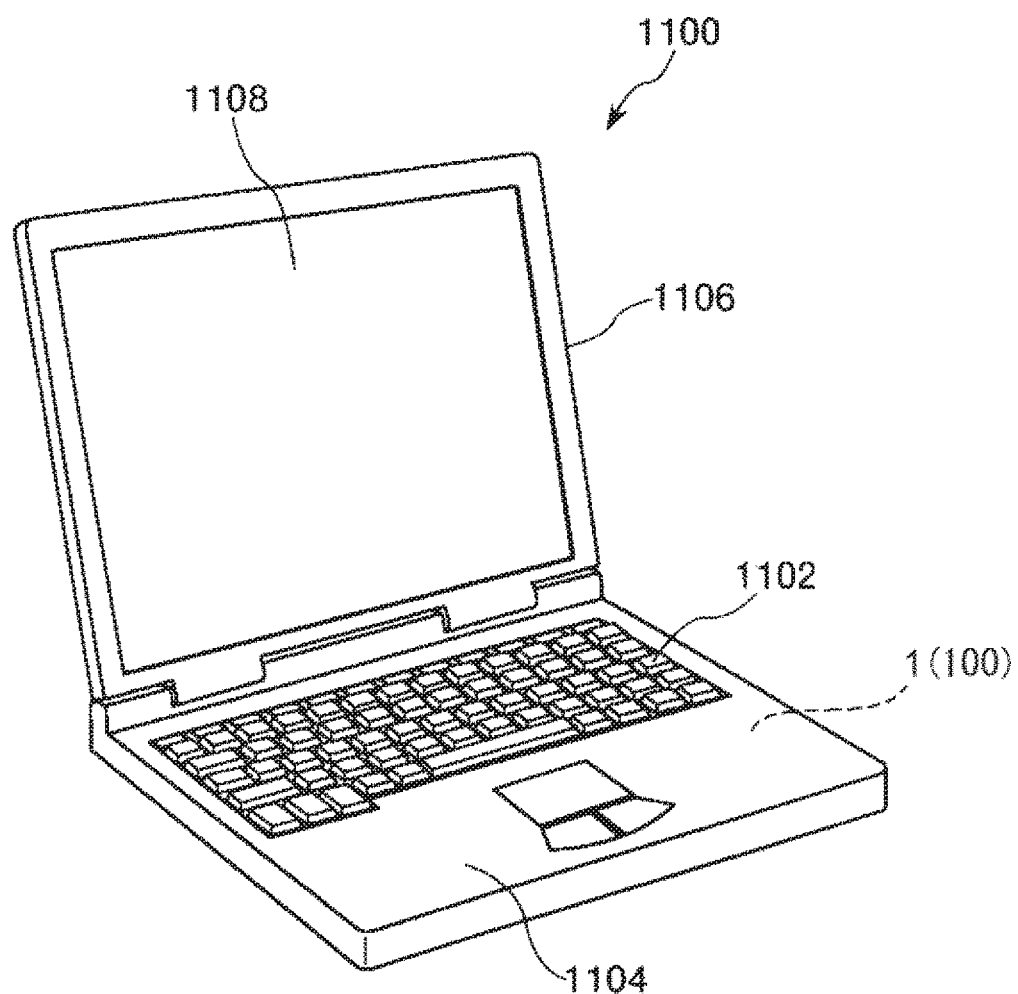
FIG. 13 is a perspective view illustrating an electronic device according to a third embodiment of the invention.

FIG. 13 is a perspective view illustrating the electronic device according to the third embodiment of the invention.

A mobile type (or note type) personal computer 1100 illustrated FIG. 13 is a computer to which the electronic device including the vibrator device according to the invention is applied. In this figure, the personal computer 1100 is configured of a main body unit 1104 including a keyboard 1102 and a display unit 1106 including a display 1108. The display unit 1106 is supported via a hinge structure so as to be rotatable with respect to the main body unit 1104. The vibrator device 1 (oscillator 100) is mounted inside such a personal computer 1100.

Such a personal computer 1100 (electronic device) has the vibrator device 1. For this reason, the effect of the vibrator device 1 described above can be enjoyed and high reliability can be demonstrated.

Fourth Embodiment

Next, an electronic device according to a fourth embodiment of the invention will be described.

Figure 14:
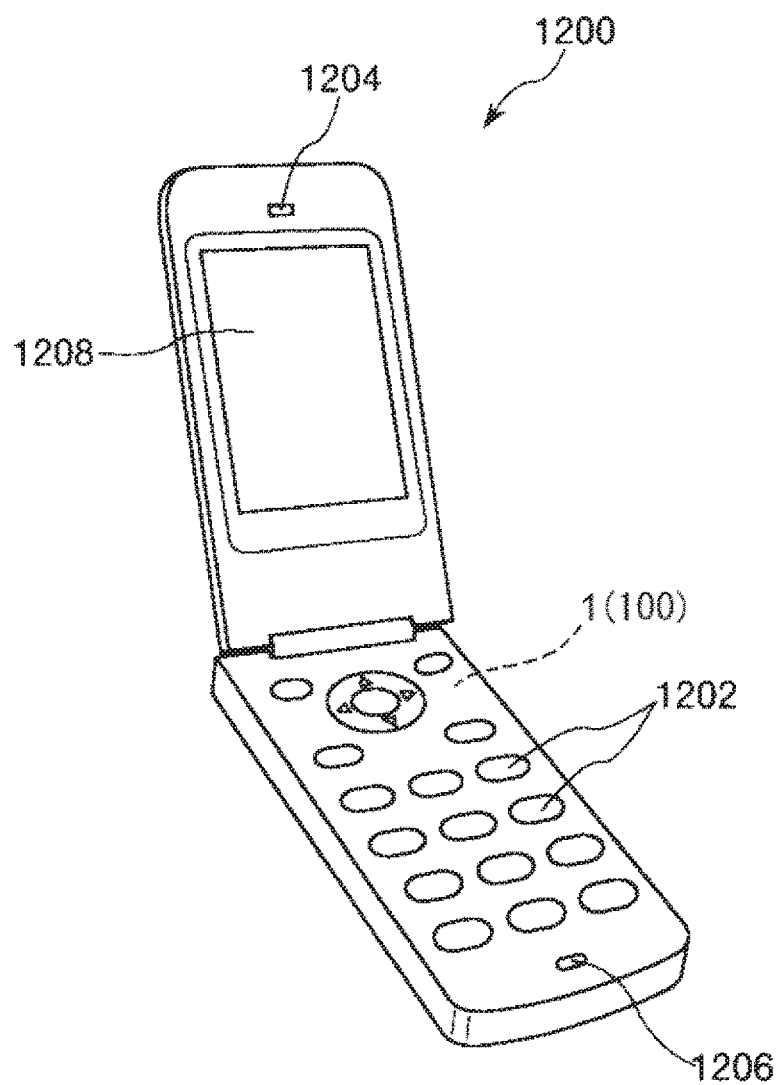
FIG. 14 is a perspective view illustrating an electronic device according to a fourth embodiment of the invention.

FIG. 14 is a perspective view illustrating the electronic device according to the fourth embodiment of the invention.

A mobile phone 1200 (including a PHS as well) illustrated in FIG. 14 is a phone to which the electronic device including the vibrator device according to the invention is applied. In this figure, the mobile phone 1200 includes an antenna (not illustrated), a plurality of operation buttons 1202, ear piece 1204, and a mouth piece 1206. A display 1208 is disposed between the operation buttons 1202 and the earpiece 1204. The vibrator device 1 (oscillator 100) is mounted inside such a mobile phone 1200.

Such a mobile phone 1200 (electronic device) has the vibrator device 1. For this reason, the effect of the vibrator device 1 described above can be enjoyed and high reliability can be demonstrated.

Fifth Embodiment

Next, an electronic device according to a fifth embodiment of the invention will be described.

Figure 15:
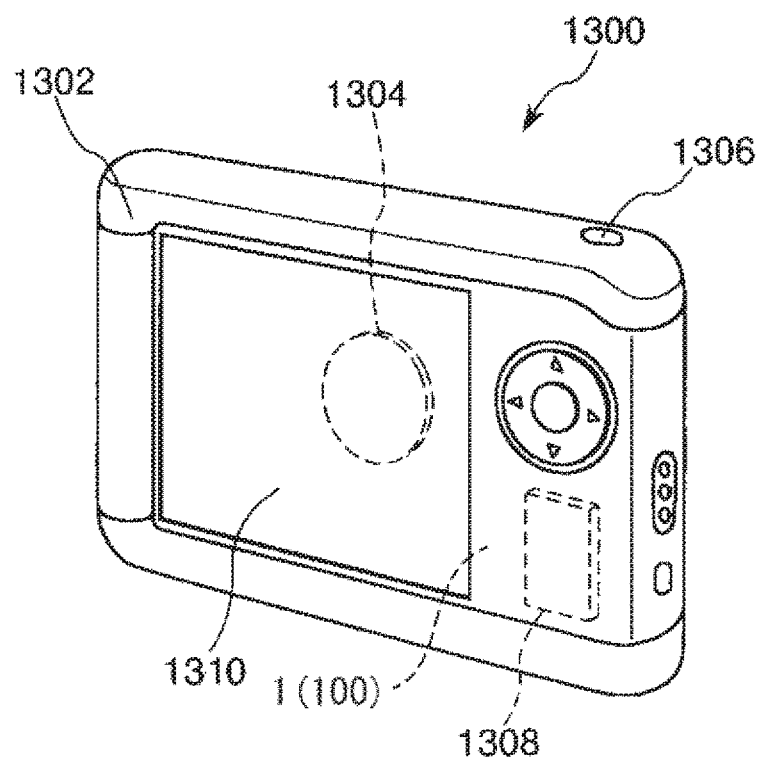
FIG. 15 is a perspective view illustrating an electronic device according to a fifth embodiment of the invention.

FIG. 15 is a perspective view illustrating the electronic device according to the fifth embodiment of the invention.

A digital still camera 1300 illustrated in FIG. 15 is a camera to which the electronic device including the vibrator device according to the invention is applied. In this figure, a display 1310 is provided on the back surface of a case (body) 1302, and is configured to perform display based on an imaging signal from a CCD. The display 1310 functions as a viewfinder displaying a subject as an electronic image. In addition, a light receiving unit 1304 including an optical lens (imaging optical system) and the CCD is provided on a front surface side (interior surface side in this figure) of the case 1302. When a photographer checks a subject image displayed on the display 1310 and presses a shutter button 1306, an imaging signal from the CCD at that time point is transmitted to and is stored in a memory 1308. The vibrator device 1 (oscillator 100) is mounted inside such a digital still camera 1300.

Such a digital still camera 1300 (electronic device) has the vibrator device 1. For this reason, the effect of the vibrator device 1 described above can be enjoyed and high reliability can be demonstrated.

In addition to the personal computer, the mobile phone, and the digital still camera, the electronic device according to the invention can be applied to, for example, a smartphone, a tablet terminal, a watch (including a smartwatch), an ink jet discharging apparatus (for example, an ink jet printer), a laptop personal computer, a television, wearable terminals such as a HMD (head mounted display), a video camera, a video tape recorder, a car navigation device, a pager, an electronic notebook (including an electronic notebook with a communication function as well), an electronic dictionary, a calculator, an electronic game device, a word processor, a workstation, a viedophone, a television monitor for crime prevention, an electronic binoculars, a POS terminal, medical devices (for example, an electronic thermometer, a sphygmomanometer, a blood glucose meter, an electrocardiogram measuring device, an ultrasonic diagnostic apparatus, and an electronic endoscope), a fish finder, various types of measuring devices, a mobile terminal base station apparatus, meters (for example, meters of a car, an aircraft, and a ship), a flight simulator, and a network server.

Sixth Embodiment

Next, a vehicle according to a sixth embodiment of the invention will be described.

Figure 16:
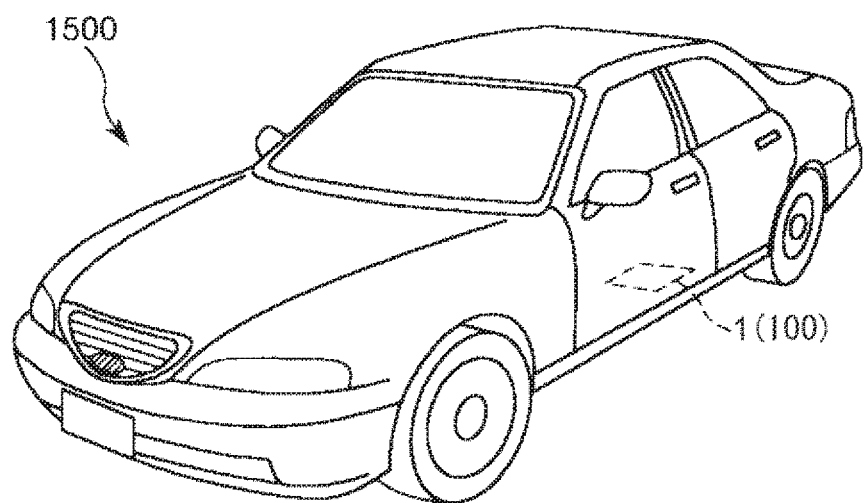
FIG. 16 is a perspective view illustrating a vehicle according to a sixth embodiment of the invention.

FIG. 16 is a perspective view illustrating the vehicle according to the sixth embodiment of the invention.

An automobile 1500 illustrated in FIG. 16 is an automobile to which the vehicle including the vibrator device according to the invention is applied. In this figure, the oscillator 100 (vibrator device 1) is mounted inside the automobile 1500. The vibrator device 1 (oscillator 100) can be widely applied to, for example, a keyless entry, an immobilizer, a car navigation system, a car air conditioner, an anti-lock brake system (ABS), an air bag, a tire pressure monitoring system (TPMS), an engine control, a battery monitor of a hybrid automobile or an electric automobile, and an electronic control unit (ECU) such as a car body posture control system.

Such an automobile 1500 (vehicle) has the vibrator device 1. For this reason, the effect of the vibrator device 1 described above can be enjoyed and high reliability can be demonstrated.

The vehicle is not limited to the automobile 1500, and can also be applied to, for example, an airplane, a ship, an automatic guided vehicle (AGV), a bipedal walking robot, and an unmanned airplane such as a drone.

Although the vibrator device, the oscillator, the electronic device, and the vehicle according to the invention have been described hereinbefore based on the illustrated embodiments, the invention is not limited thereto. A configuration of each unit can be substituted with any configuration having the same function. Any other configuration elements may be added to the invention. In addition, the invention may be a combination of any two or more configurations (characteristics) out of each of the embodiments.

Although each of the first terminals, the wiring unit, and the second terminals is electrically connected to wiring via a wire in the embodiments described above, a connecting method thereof is not particularly limited. In addition, although the vibrator has the vibrator element and the vibrator element package accommodating the vibrator element, the configuration of the vibrator is not particularly limited.

In addition, although a configuration where the vibrator device is applied to the oscillator has been described in the embodiments described above, the configuration is not limited thereto. For example, the vibrator device may be applied to a physical quantity sensor that can detect a physical quantity such as acceleration and angular velocity. In this case, for example, a vibrator element that can detect angular velocity and acceleration may be used as the vibrator element of the vibrator, and a circuit element including a drive circuit that drives the vibrator element and a detection circuit that detects a physical quantity according to an output from the vibrator element may be used as the circuit element.

The entire disclosure of Japanese Patent Application No. 2017-049699, filed Mar. 15, 2017 is expressly incorporated by reference herein.

What is claimed is:
1. A vibrator device comprising:
a base that has a first terminal;
a circuit element that is disposed on the base and has a second terminal;
a vibrator that includes a vibrator element and a vibrator element package, and is positioned between the first terminal and the second terminal in plan view of the base;
a wiring unit that is disposed on the vibrator;
a first wire that electrically connects the first terminal and the wiring unit together; and
a second wire that electrically connects the wiring unit and the second terminal together, wherein
the wiring unit has a substrate disposed on the vibrator element package and wiring provided on the substrate.

2. The vibrator device according to claim 1, wherein the vibrator is disposed on the base so as not to overlap the circuit element in the plan view of the base.

3. The vibrator device according to claim 1, wherein
the vibrator element package has a base body, in which the vibrator element is disposed, and a lid, which is bonded to the base body so as to accommodate the vibrator element between the lid and the base body, and is disposed such that the lid faces a base side,
a third terminal electrically connected to the vibrator element is disposed on a surface of the base body on a side opposite to the base side,
the plurality of second terminals are disposed, and
the vibrator device further comprises:
a third wire that electrically connects a second terminal that is not electrically connected to the wiring unit, out of the plurality of second terminals, and the third terminal together.

4. The vibrator device according to claim 3, wherein
the base body has a base portion and a frame-like side wall portion stretching from the base portion, and
at least one of a connecting portion between the wiring unit and the third wire and a connecting portion between the third terminal and the third wire overlaps the side wall portion in the plan view of the base.

5. The vibrator device according to claim 3, wherein
the two third terminals are provided and are disposed as a pair of the third terminals,
a center of the surface is positioned between the pair of third terminals, and the wiring unit is provided between the pair of third terminals.

6. The vibrator device according to claim 1, wherein a power supply voltage or a reference potential is applied to the first terminal.

7. The vibrator device according to claim 1, wherein
the base is in a quadrilateral shape having a first side, a second side, a third side, and a fourth side in the plan view of the base, and
the plurality of terminals, including the first terminal, are arranged along the first side, the second side, the third side, and the fourth side.

8. The vibrator device according to claim 1, wherein a thickness of the vibrator is greater than a thickness of the circuit element.

9. The vibrator device according to claim 1, further comprising:
a mold portion that is disposed on the base and covers the circuit element and the vibrator.

10. A vibrator device comprising:
a base that has a first terminal;
a circuit element that has a second terminal electrically connected to the first terminal; and
a vibrator on which a wiring unit is disposed, the vibrator having a vibrator element package, wherein:
the first terminal and the second terminal are electrically connected to each other via the wiring unit, and
the wiring unit has a substrate disposed on the vibrator element package and wiring provided on the substrate.

11. An oscillator comprising:
a base that has a first terminal;
a circuit element that is disposed on the base and has a second terminal;
a vibrator that includes a vibrator element and a vibrator element package, and is positioned between the first terminal and the second terminal in plan view of the base;
a wiring unit that is disposed on the vibrator;
a first wire that electrically connects the first terminal and the wiring unit together; and
a second wire that electrically connects the wiring unit and the second terminal together, wherein
the wiring unit has a substrate disposed on the vibrator element package and wiring provided on the substrate.

12. An electronic device comprising the vibrator device according to claim 1.

13. A vehicle comprising the vibrator device according to claim 1.

* * * * *